United States Patent
Ono et al.

(10) Patent No.: US 6,807,199 B2
(45) Date of Patent: Oct. 19, 2004

(54) WAVELENGTH INSPECTION METHOD OF A SEMICONDUCTOR LASER DIODE AND A WAVELENGTH INSPECTION UNIT THEREOF

(75) Inventors: Haruyoshi Ono, Yamanashi (JP); Isao Baba, Yamanashi (JP)

(73) Assignee: Fujitsu Quantum Devices Limited, Yamanshi (JP)

( * ) Notice: Subject to any disclaimer, the term of this patent is extended or adjusted under 35 U.S.C. 154(b) by 146 days.

(21) Appl. No.: 10/180,032

(22) Filed: Jun. 27, 2002

(65) Prior Publication Data

US 2003/0002546 A1 Jan. 2, 2003

(30) Foreign Application Priority Data

Jun. 29, 2001 (JP) ......................................... 2001-198337

(51) Int. Cl.[7] ............................... H01S 3/10; H01S 3/13
(52) U.S. Cl. ...................... 372/20; 372/32; 372/29.011; 372/29.015
(58) Field of Search ............................. 372/20, 32, 34, 372/29.011, 29.015, 29.02

(56) References Cited

U.S. PATENT DOCUMENTS 5,867,514 A   2/1999   Anderson ..................... 372/38

6,212,210 B1 * 4/2001 Serizawa ..................... 372/32

FOREIGN PATENT DOCUMENTS

CN            396669            7/2000

OTHER PUBLICATIONS

Copy of translation of Republic of China (Taiwanese) Patent Office Action for corresponding Taiwanese Patent Application No. 91114198 dated Jun. 11, 2003.

* cited by examiner

*Primary Examiner*—Don Wong
*Assistant Examiner*—James Menefee
(74) *Attorney, Agent, or Firm*—Westerman, Hattori, Daniels & Adrian, LLP

(57) ABSTRACT

In order to tune an oscillation wavelength of a semiconductor laser diode to a target wavelength, the amount of change of a wavelength to the amount of change of a wavelength varying item is determined by actual measurement and a basic wavelength coefficient is renewed by using the ratio of both amounts of change as a corrective wavelength coefficient, and thus the characteristic when the wavelength of an actual device is made closer to a target wavelength is utilized.

16 Claims, 5 Drawing Sheets

WAVELENGTH INSPECTION METHOD OF A SEMICONDUCTOR LASER DIODE AND A WAVELENGTH INSPECTION UNIT THEREOF

BACKGROUND OF THE INVENTION

1. Field of the Invention

The present invention relates to a method for inspecting conditions under which semiconductor laser diodes (hereinafter called LDs) output a fixed wavelength and a unit for the same.

2. Description of the Related Art

FIG. 1 shows the construction of a general distributed feedback LD. In the LD, when a current flows into the PN junction portion in an active layer 11 from the upper electrode 12 to the lower electrode 12 and the recombination of electrons and holes takes place in the vicinity of the junction, the spontaneous emission of light corresponding to the band gap of the semiconductor in the active layer takes place. When the light having certain wavelength in accord with an interval of groove 13 travels in LD, optical amplification takes place and LD oscillates at the wavelength. It is well known that the change of the temperature of the device or heat generated due to injected current generally makes occurrence of expansion or contraction of the semiconductor crystal such as the active layer and the grooves of LD, and that the optical characteristics of thus oscillating LD depends on the temperature of the device or heat generated due to injected current as above described, so, as a result, the oscillation wavelength is shifted. Furthermore, the amount of the shift of the oscillation wavelength of each LD may be somewhat varied in accordance with the accuracy of the interval of the groove, the value of the drive current, and the crystal structure of the active layer. Therefore, it is required to inspect precisely the temperature dependency of the oscillation wavelength of each of the LDs.

FIG. 2 shows a wavelength inspection unit.

In the drawing, an LD module 1 is shown, and, inside the module 1, an LD, a laser mount for mounting the LD, a thermistor for monitoring the temperature of a heat sink portion to exhaust heat of the mount, and a Peltier element to cool and heat the laser mount (not shown) are mounted. A measurement jig 2 contains an electrical and thermal interface to the LD module 1. A laser driving power source 4, a temperature controller 5, and an photo detection portion 6 are put together in a current-light output measurement unit (hereinafter called an I-L measuring unit) 3. The photo detection portion 6 monitors the optical power of the LD through a fiber 9. A wavelength measurement apparatus 7 counts the output wavelength of the LD. A computer 8 gives control data to each device, receives data obtained at each device, and processes the data and controls the system in accordance with the measurement procedures.

FIG. 3 shows a conventional example of a wavelength tuning process for tuning an LD to a fixed wavelength in a case in which the wavelength inspection unit is used and a wavelength varying item is a laser temperature. In this case, since the laser temperature cannot be directly measured, the temperature of the heat sink on which a LD is mounted is defined as the laser temperature.

For example, the initial temperature of the heat sink portion of the LD is set at 25° C. A current I, which is larger than a threshold current for laser oscillation, is applied to the LD, and a wavelength $\lambda_0$ is measured. The ratio of the change of oscillation wavelength to the change of heat sink temperature is defined as a wavelength coefficient, and its initial value is defined as a basic wavelength coefficient $A_0$. Therefore, a heat sink temperature $T_1$ is required to be $(\lambda_T-\lambda_0)/A_0+25°$ C. in order to obtain a target wavelength $\lambda_T$. A wavelength $\lambda_1$ is measured at the temperature, and it is checked whether or not the difference between the wavelength $\lambda_1$ and the target wavelength $\lambda_T$ is in an allowable range. If it is out of specification, it is checked whether the difference is in another fine adjustment window (the range of wavelength is slightly wider than the allowable range). If the difference is within the another fine adjustment window, the wavelength $\lambda_1$ can be broght to the target wavelength $\lambda_T$ by changing the temperature a little. Then, a process for fine tuning, in which the temperature of the heat sink portion is changed by a certain temperature step and the measurement is continued until the oscillation wavelength reaches the target wavelength, is performed. On the other hand, if the difference is out of the fine adjustment window, the heat sink temperature $T_2$ is set to $(\lambda_T-\lambda_1)/A_0+T_1$ by using the target wavelength $\lambda_T$ and the basic coefficient $A_0$. Hereinafter, in the same way, an nth wavelength $\lambda_n$ is measured, and then the wavelength $\lambda_n$ is brought close to the target wavelength $\lambda_T$ by continuing the operation until the difference comes within the allowable range or the fine adjustment window.

SUMMARY OF THE INVENTION

In the conventional method, it is possible to set the heat sink temperature for making an LD oscillated at a wavelength close to a target wavelength, but it is required to adjust the oscillation wavelength of the LD to the target wavelength in a further shorter time.

The initial basic wavelength coefficient used in the conventional method may be a theoretical value or an actual value, and it is a value which is characterized in that the amount of change of a wavelength is made to correspond to the amount of change of a wavelength varying item. However, the actual wavelength coefficient of each LD is different from each other. Therefore, when wavelength coefficients which have large differences from each other are used, the wavelength varying item is needed to be changed by large amount to result in a large difference in wavelength. Accordingly, a number of trial is required in order to reach the target wavelength.

FIG. 4 shows the difference between the conventional tuning method and a tuning method of the present invention. The solid line shows a characteristic of wavelength to temperature having a basic wavelength coefficient $A_0$, and the dotted line shows the characteristic of wavelength to temperature of an LD to be tested. When the temperature of a heat sink portion is $T_0$ and an oscillation wavelength is $\lambda_0$ at the beginning, the temperature $T_1$ at the crosspoint of the straight line having the basic wavelength coefficient $A_0$ and a straight line through a target wavelength $\lambda_T$ is defined as a first setting temperature of the heat sink. An oscillation wavelength $\lambda_1$ at this crosspoint is shown by point B. In the conventional method, a straight line having the same inclination as the basic wavelength coefficient $A_0$ is drawn from point B and the temperature is set to the temperature pointed at the crosspoint $C_1$ of the straight line and the straight line through the target wavelength $\lambda_T$ to obtain the point $D_1$ for a second wavelength. On the other hand, in the present invention, an alternate long and short dash line having the inclination defined as the first wavelength coefficient $A_1$ from point B is drawn, and the crosspoint $C_2$ of the line and the straight line through the target wavelength $\lambda_T$ is obtained. Since the wavelength when the temperature is set at this $C_2$ is a wavelength pointed by $D_2$, it is clearly understood that the wavelength pointed by $D_2$ is closer to the target wavelength $\lambda_T$ than the one pointed by $D_1$.

In a wavelength inspection method of the present invention, tuning is performed such that a corrective wavelength coefficient in stead of the basic wavelength coefficient is obtained based on the amount of change of a wavelength varying item and the amount of change of a measured wavelength to the target wavelength, which is arisen from the above change of the wavelength varying item.

Furthermore, in a wavelength inspection method according to the present invention, a corrective wavelength coefficient is obtained in tuning of the first time and, after that, tuning is performed by using the so obtained corrective wavelength coefficient as a basic wavelength coefficient.

Furthermore, in a wavelength inspection method according to the present invention, tuning is performed each time by determining a corrective wavelength coefficient.

Furthermore, in a wavelength inspection method according to the present invention, the wavelength varying item is limited to the temperature or injected current of an LD. However, since the temperature of an LD cannot be directly measured, the temperature of the heat sink on which the LD is mounted is used as a substitute.

Furthermore, in a wavelength inspection method according to the present invention, the basic wavelength coefficient or the corrective wavelength coefficient when a measured wavelength reaches the target wavelength, is used as a basic wavelength coefficient when tuning of another LD is performed. Here, the basic wavelength coefficient is used only when the target wavelength is realized in tuning of the first time.

Furthermore, in a wavelength inspection method according to the present invention, when tuning of a plurality of LDs is performed, the average of the final wavelength coefficients (basic wavelength coefficients or corrective wavelength coefficients) already obtained from plural LDs is used as a basic wavelength coefficient in tuning the wavelength of a next one.

Furthermore, in a wavelength inspection method according to the present invention, when tuning of a plurality of LDs is performed, the final wavelength coefficient (basic wavelength coefficient or corrective wavelength coefficient) when tuning of a first LD has been performed is used as a basic wavelength coefficient of all the remaining LDs.

Furthermore, in a wavelength inspection method according to the present invention, when tuning of one LD is performed for a plurality of target wavelengths, tuning for each target wavelength is performed by determining a corrective wavelength coefficient each time.

Furthermore, in a wavelength inspection method according to the present invention, when tuning of one LD is performed for a plurality of target wavelengths, a corrective wavelength coefficient determined in tuning of the first time is used as a basic wavelength coefficient when tuning of the remaining target wavelengths is performed.

Furthermore, in a wavelength inspection method according to the present invention, when tuning is performed for a plurality of target wavelengths, the average of the final wavelength coefficients (basic wavelength coefficient or corrective wavelength coefficient) of some is used as a basic wavelength coefficient in tuning a next one.

Furthermore, in a wavelength inspection method according to the present invention, the average of the final wavelengths when tuning of one LD is performed for a plurality of target wavelengths is used as a basic wavelength coefficient in tuning another LD.

Furthermore, in a wavelength inspection method according to the present invention, when tuning for a plurality of target wavelengths is performed, only in tuning of the first time for a target wavelength, the final wavelength coefficient is obtained by determining a corrective wavelength coefficient, but, in tuning of the others, the final wavelength coefficient is used as a basic wavelength coefficient and the tuning is performed based on the conventional method.

A wavelength inspection unit according to the present invention is provided with a laser control portion for controlling a wavelength varying item to LDs, a wavelength measuring portion for measuring an oscillation wavelength, and a computer storing a basic wavelength coefficient showing a basic value of the ratio between the amount of change of the wavelength varying item and the amount of change of a wavelength caused thereby, performing an operation of a corrective wavelength coefficient based on the change of wavelength caused when the wavelength varying item is practically changed, performing an operation of controlling the wavelength varying item so that a wavelength reaches a target wavelength by using a basic wavelength coefficient or a corrective wavelength coefficient, and controlling tuning of a wavelength by giving and receiving data such as a wavelength, temperature, current, control signal, etc., between devices.

Furthermore, in a wavelength inspection unit according to the present invention, a laser control portion comprising a temperature control portion for controlling the temperature of a LD and a current control portion for supplying a current to the LD is contained.

Furthermore, in a wavelength inspection unit according to the present invention, a computation of the value of a wavelength varying item by which a wavelength can be brought to a target wavelength is performed by using a corrective wavelength coefficient, and the laser control portion controls a LD by using the value of a wavelength varying item.

Furthermore, in a wavelength inspection unit according to the present invention, the wavelength of a LD is measured at the value of a wavelength varying item determined by an operation portion and a corrective wavelength coefficient is corrected once again based on the amount of change of the wavelength varying item and the difference between a measured wavelength and a target wavelength.

DESCRIPTION OF THE PREFERRED EMBODIMENTS

Figure 5:
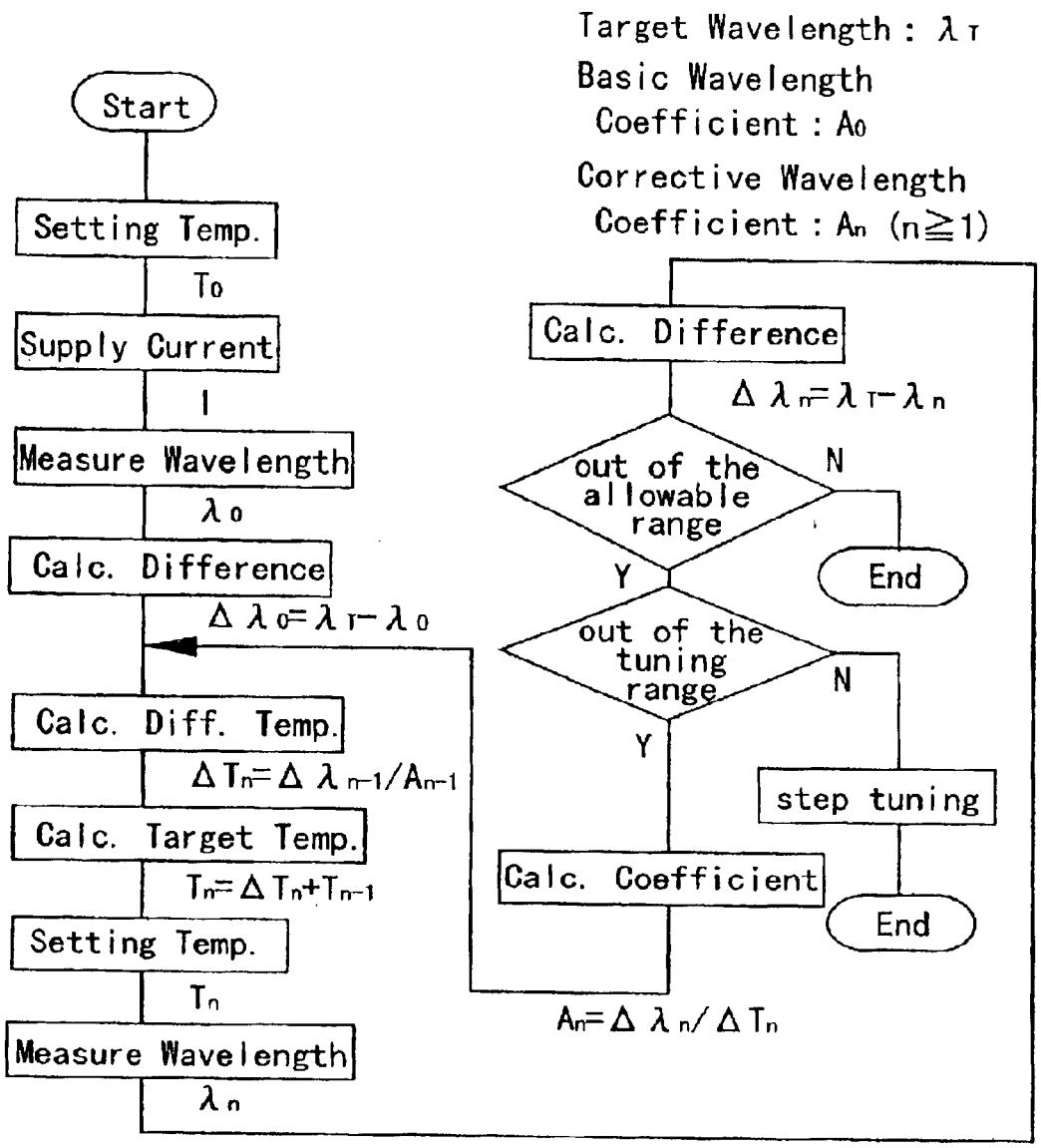
FIG. 5 is a flow chart showing a tuning process of the present invention.

FIG. 5 shows a wavelength tuning process of one embodiment of the present invention in which the wavelength varying item is the temperature of a LD in the same way as in the conventional example.

The processes up to the first wavelength measurement are performed in the same way as in the conventional example. When the value of $\lambda_1$ is out of a fine adjustment window, heat sink temperature $T_2$ is set to be $(\lambda_T-\lambda_1)/A_1+T_1$ by using target wavelength $\lambda_T$ and wavelength coefficient $A_1=(\lambda_1-\lambda_0)/(T_1-T_0)$. Hereinafter, in the same way, heat sink temperature $T_n$ is set to be $(\lambda_T\lambda_{n-1})/A_{n-1}+T_{n-1}$ by using wavelength coefficient $A_{n-1}=(\lambda_{n-1}-\lambda_{n-2})/(T_{n-1}-T_{n-2})$, nth wavelength $\lambda_n$ is measured, and the processes are continued so that a measured value may be within an allowable range to be close to a target wavelength. Here, $A_n$ under the condition of $n \geq 1$ is called a corrective wavelength coefficient.

As described above, as a conventional example and an embodiment, methods for determining a heat sink temperature to realize a target wavelength under a fixed current injecting to a LD are shown. By the way, there is another method for determining an injection current to a LD to realize a target wavelength under a certain heat sink temperature. In this case, a current can be determined by using the ratio of the change of wavelength to the change of current as a wavelength coefficient where the value of current is used instead of the value of temperature, in the same way as a heat sink temperature being determined.

Figure 1:
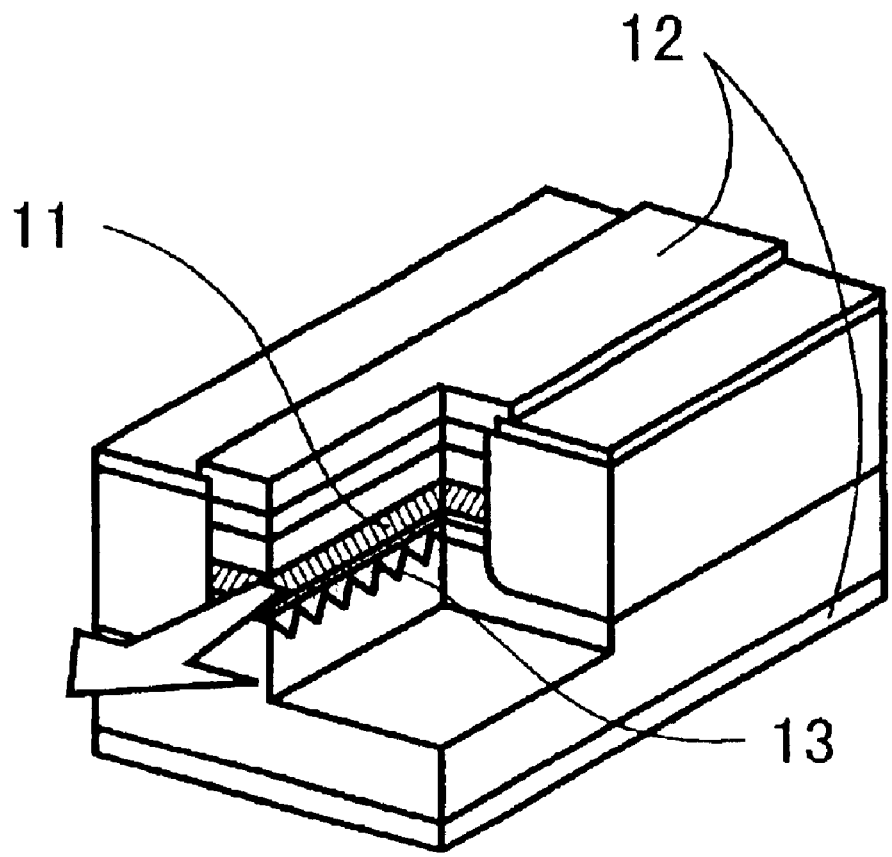
FIG. 1 shows the construction of a semiconductor laser diode.
Figure 2:
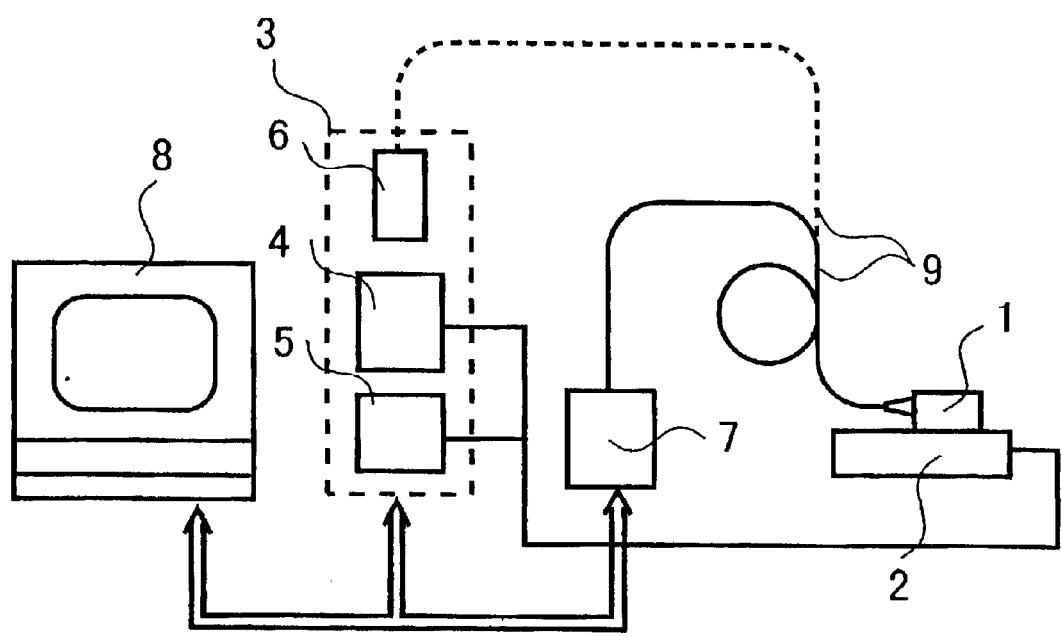
FIG. 2 shows the construction of a wavelength inspection unit.
Figure 3:
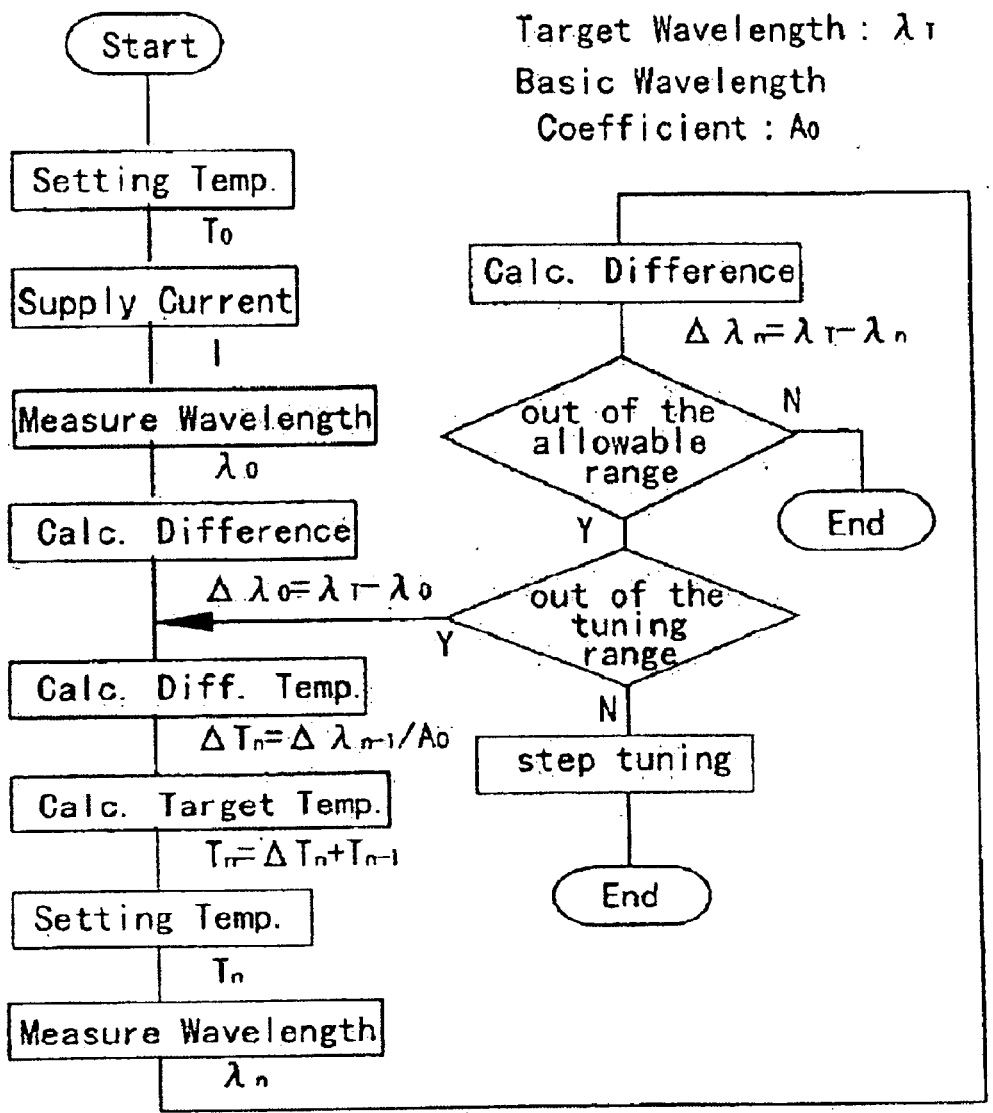
FIG. 3 is a flow chart showing a tuning process of a conventional example.
Figure 4:
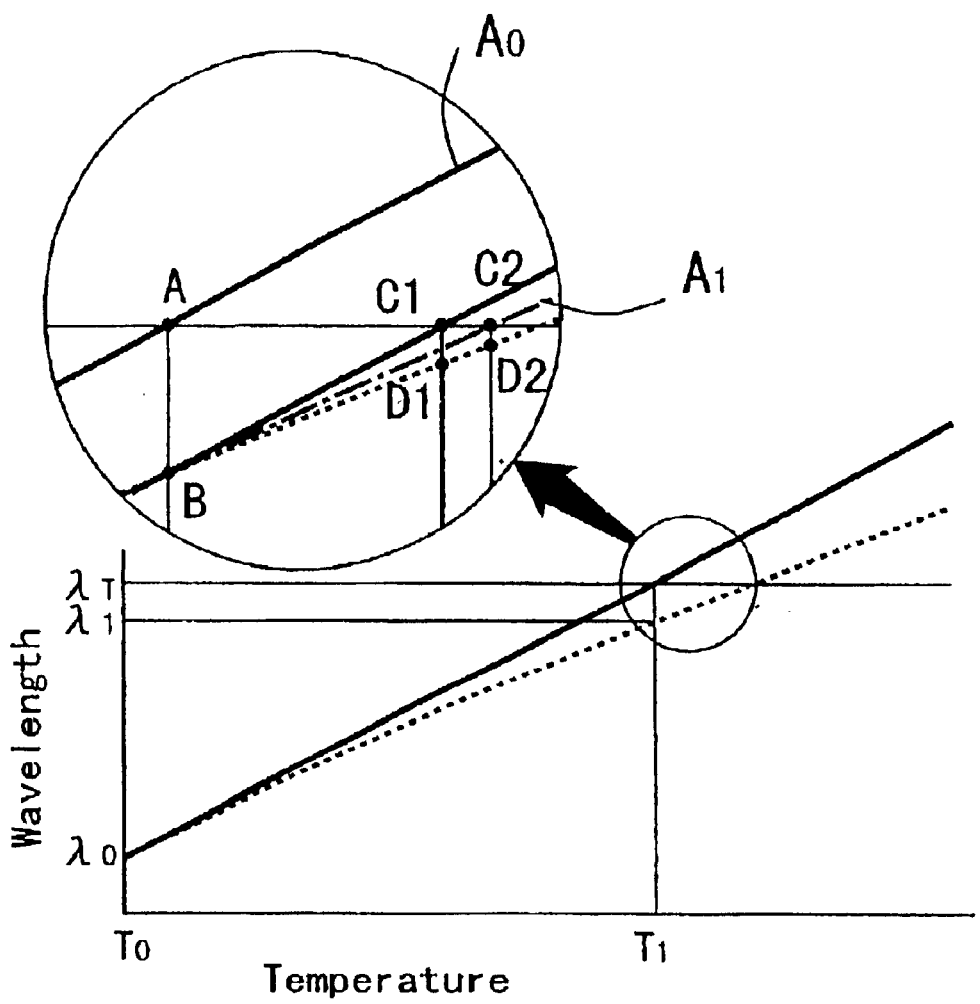
FIG. 4 shows the difference between wavelength tuning of the present invention and that of a conventional example.

According to one embodiment of the present invention, a corrective wavelength coefficient is determined once, and, after that, tuning can be performed based on the initial corrective wavelength coefficient only, without determining corrective wavelength coefficients in succession. Although, in this case more times of tuning are required than in the case where tuning is performed by determining corrective wavelength coefficients in succession, fewer times of tuning can be achieved than in the case where tuning is performed by using a conventional basic wavelength coefficient. Since an operation for determining a corrective wavelength coefficient is performed only once, shortening of the processing time can be expected. Moreover, in the above-described tuning of wavelength, it is a matter or course that tests and inspections are performed while the optical power is monitored by the photo detection portion 6 in the I-L measuring unit 3 of the wavelength inspection unit in FIG. 2 and while it is confirmed that the LD is oscillated or the optical power is at a fixed value.

Thus, when the processes for tuning wavelength according to the present invention are performed, the processing time for wavelength inspection can be shortened, because a wavelength of the LD reaches a target wavelength in fewer tuning times than the conventional processes.

What is claimed is:

1. A wavelength inspection method of a semiconductor laser diode, in which tuning of the semiconductor laser diode using a wavelength varying item for varying a wavelength and a basic wavelength coefficient showing the relation of the amount of change of a wavelength to the change of value of the wavelength varying item is performed, comprising the steps of:
   performing a computation of a first value of the wavelength varying item for obtaining a target wavelength based on the basic wavelength coefficient;
   and performing a computation of a corrective wavelength coefficient by obtaining a measured wavelength of the semiconductor laser diode at the first value of the wavelength varying item, based on the difference between the measured wavelength and the target wavelength.

2. A wavelength inspection method of a semiconductor laser diode as claimed in claim 1, further comprising the steps of:
   performing a computation of a second value of the wavelength varying item for obtaining the target wavelength, based on the corrective wavelength coefficient, and making a measurement for obtaining another measured wavelength of the semiconductor laser diode corresponding to the second value of the wavelength varying item; and repeating the computation and the measurement until the measured wavelength comes within an allowable range of the target wavelength.

3. A wavelength inspection method of a semiconductor laser diode as claimed in claim 2, wherein a computation of the corrective wavelength coefficient is performed once again based on the difference between the another measured wavelength and the target wavelength.

4. A wavelength inspection method of a semiconductor laser diode as claimed in claim 1, wherein the value of the wavelength varying item is a temperature of the semiconductor laser diode or an amount of current injected into the semiconductor laser diode.

5. A wavelength inspection method of a semiconductor laser diode as claimed in any of claims 1 to 4, wherein, in the tuning of the semiconductor laser diode, the basic wavelength coefficient or the corrective wavelength coefficient is used as another basic wavelength coefficient in tuning another semiconductor laser diode.

6. A wavelength inspection method of a semiconductor laser diode as claimed in any of claims 1 to 4, wherein the tuning is performed on a plurality of semiconductor laser diodes and after the tuning, the basic wavelength coefficient or the corrective wavelength coefficient in each tuning is obtained and their average is used as another basic wavelength coefficient in tuning another semiconductor laser diode.

7. A wavelength inspection method of a semiconductor laser diode as claimed in any of claims 1 to 4, wherein a plurality of the target wavelengths is set to semiconductor laser diodes and the tuning is performed for each of the target wavelengths.

8. A wavelength inspection method of a semiconductor laser diode as claimed in claim 7, wherein the basic wavelength coefficient or the corrective wavelength coefficient when the measured wavelength reaches a first one of the plurality of the target wavelengths in tuning is used as the basic wavelength coefficient in tuning for others of the target wavelengths.

9. A wavelength inspection method of a semiconductor laser diode as claimed in claim 7, wherein a plurality of the target wavelengths is set to the semiconductor laser diodes, and wherein, in tuning for one of the target wavelengths, the average of the basic wavelength coefficients or the corrective wavelength coefficients when measured wavelength reaches the target wavelength earlier is used as the basic wavelength coefficient.

10. A wavelength inspection method of a semiconductor laser diode as claimed in claim 7, wherein a plurality of the target wavelengths is set to the semiconductor laser diodes, and wherein the average of the basic wavelength coefficients or the corrective wavelength coefficients when the measured wavelength reaches the target wavelength is used as the basic wavelength coefficient in tuning another semiconductor laser diode.

11. A wavelength inspection method of a semiconductor laser diode as claimed in claim 1, wherein, in the tuning of a plurality of semiconductor laser diodes, the basic wavelength coefficient or the corrective wavelength coefficient in a first one of the semiconductor laser diodes is used as the basic wavelength coefficient in tuning the others of the plurality of semiconductor laser diodes.

12. A wavelength inspection method of a semiconductor laser diode as claimed in claim 1, wherein a plurality of the target wavelengths is set to the semiconductor laser diodes, and wherein the basic wavelength coefficient or the corrective wavelength coefficient when the measured wavelength reaches the target wavelength in tuning for the target wavelength which is first performed is used as the basic wavelength coefficient in tuning for the remaining target wavelengths.

13. A wavelength inspection unit of a semiconductor laser diode comprising:

- a laser diode control portion for controlling a value of a wavelength varying item corresponding to the semiconductor laser diode;
- a wavelength measuring portion for measuring a wavelength of the semiconductor laser diode; and
- a computer obtaining a difference of wavelengths of the semiconductor laser diode before and after the change of the wavelength varying item given to the semiconductor laser diode from the wavelength measuring portion, performing a computation of a corrective wavelength coefficient by modifying a basic wavelength coefficient based on the amount of change of the wavelength varying item and the difference between a target wavelength and a measured wavelength, performing a computation of a value of the wavelength varying item so that the measured wavelength reaches the target wavelength by using the basic wavelength coefficient or the corrective wavelength coefficient, outputting a value of the wavelength varying item to the laser diode control portion, and inputting data of a temperature and current.

14. A wavelength inspection unit of a semiconductor laser diode as claimed in claim 13, wherein the wavelength varying item of the semiconductor laser diode is a temperature or an amount of current, and wherein the laser diode control portion comprises a temperature control portion and a current control portion of the semiconductor laser diode.

15. A wavelength inspection unit of a semiconductor laser diode as claimed in claim 13, wherein the computer determines a value of the wavelength varying item by which the target wavelength can be obtained by using the modified corrective coefficient, and wherein the laser diode control portion controls the semiconductor laser diode by using the value of the wavelength varying item.

16. A wavelength inspection unit of a semiconductor laser diode as claimed in claim 15, wherein the wavelength measuring portion measures a wavelength of the semiconductor laser diode corresponding to the value of the wavelength varying item determined by the computer, and wherein the corrective wavelength coefficient is modified once again based on the amount of change of the wavelength varying item and the difference between the measured wavelength and the target wavelength.

* * * * *